United States Patent
Lee et al.

(10) Patent No.: US 7,568,489 B2
(45) Date of Patent: Aug. 4, 2009

(54) METHOD OF AND APPARATUS FOR ELUTING IMPURITIES

(75) Inventors: Sung-Jae Lee, Yongin-si (KR);
Bok-Soon Ko, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 863 days.

(21) Appl. No.: 10/893,233

(22) Filed: Jul. 19, 2004

(65) Prior Publication Data

US 2005/0028840 A1 Feb. 10, 2005

(30) Foreign Application Priority Data

Aug. 7, 2003 (KR) .................. 10-2003-0054748

(51) Int. Cl.
*B08B 3/04* (2006.01)

(52) U.S. Cl. ............... 134/66; 134/1.1; 134/1.3; 134/18; 134/22.1; 134/43; 134/78; 134/109; 134/153; 134/902; 118/301; 118/504; 156/345.19; 156/345.3; 216/45; 427/272; 427/282

(58) Field of Classification Search .............. 118/301, 118/504; 134/1.1, 1.3, 18, 22.1, 43, 66, 78, 134/109, 153, 902; 156/345.19, 345.3; 216/45; 427/272, 282

See application file for complete search history.

(56) References Cited

U.S. PATENT DOCUMENTS

| | | | |
|---|---|---|---|
| 5,271,798 A | 12/1993 | Sandhu et al. | 156/638 |
| 6,416,583 B1* | 7/2002 | Kitano et al. | 118/680 |
| 6,514,776 B1 | 2/2003 | Yanagi et al. | 438/14 |
| 6,519,031 B2 | 2/2003 | Gilton et al. | 356/316 |
| 2001/0017148 A1* | 8/2001 | Kawaguchi | 134/56 R |
| 2002/0134406 A1* | 9/2002 | Heo et al. | 134/3 |
| 2003/0142309 A1* | 7/2003 | Kuebler et al. | 356/338 |
| 2003/0192570 A1* | 10/2003 | Thakur et al. | 134/1.3 |

FOREIGN PATENT DOCUMENTS

JP 09-005221 1/1997

\* cited by examiner

*Primary Examiner*—Frankie L Stinson
*Assistant Examiner*—Samuel A Waldbaum
(74) *Attorney, Agent, or Firm*—Volentine & Whitt, PLLC

(57) ABSTRACT

Impurities can be eluted simultaneously from a plurality of local areas of a surface layer of a semiconductor substrate. A supporting unit supports the substrate, and a sample plate is disposed on the surface of the substrate. The sample plate has a plurality of holes that expose the local areas of the surface of the substrate. Eluant is provided onto the local areas of the surface layer of the substrate through the holes in the sample plate. The impurities are thus dissolved by the eluant to produce a sample. A nozzle transfers the sample from the local areas of the surface of the substrate to a plurality of sample cups. Therefore, samples from the surface layer of the substrate may be produced in a short amount of time.

20 Claims, 6 Drawing Sheets

METHOD OF AND APPARATUS FOR ELUTING IMPURITIES

BACKGROUND OF THE INVENTION

1. Field of the Invention

The present invention relates to an apparatus for eluting impurities from a substrate. More particularly, the present invention relates to an apparatus for eluting impurities from a semiconductor substrate to produce a liquid sample by which impurities in the substrate can be analyzed.

2. Description of the Related Art

Generally, a semiconductor device is manufactured by performing a fabrication (FAB) process for forming an electric circuit on a semiconductor substrate comprising a silicon wafer, an electrical die sorting (EDS) process for inspecting electrical characteristics of the electric circuit, and a packaging process for separating the semiconductor substrate into individual semiconductor chips and sealing each of the semiconductor chips using an epoxy resin. The FAB process includes a deposition process for forming a thin layer on the semiconductor substrate, a CMP process for chemically and mechanically polishing the thin layer, a photolithography process for forming a photoresist pattern on the thin layer, an etching process for etching the thin layer into an electrical pattern using the photoresist pattern as a mask, an ion implantation process for implanting ions into a predetermined region of the semiconductor substrate, a cleaning process for cleaning impurities from the semiconductor substrate, and an inspection process for inspecting a surface of the semiconductor substrate so as to detect defects in the thin layer or pattern.

The impurities, such as metallic contaminants, usually reduce the yield and performance of the semiconductor devices. Therefore, a great deal of importance has been placed on the inspection process as a means to improve the yield and performance of semiconductor devices, especially in the case of semiconductor devices having a high degree of integration.

The inspecting process analyzes impurities in an upper layer of the semiconductor substrate. To this end, the inspecting process includes an extraction process for extracting a sample containing the impurities, and an analysis process for analyzing the sample. An exemplary apparatus for and method of extracting such a sample are disclosed in U.S. Patent Publication No. 2002-134406. According to U.S. Patent Publication No. 2002-134406, the apparatus for extracting the sample includes a closed processing chamber, a loading/unloading unit for loading/unloading a wafer into/from the chamber, a vapor decomposing unit disposed inside the processing chamber for decomposing a silicon oxide layer on a wafer disposed in the chamber, and a scanning unit disposed inside the processing chamber for scanning the wafer.

Meanwhile, U.S. Pat. No. 6,519,031 (issued to Gilton et. al.) discloses a surface analysis device for obtaining a sample from a predetermined local portion of a wafer by dissolving an isolated portion of the wafer in an eluant comprising an etching solution or a solvent such as an organic solvent. The sample so obtained includes various impurities. The impurities are analyzed using a destructive analysis device such as an atomic absorption spectroscope or an inductively coupled plasma (ICP)-mass spectroscope, and a non-destructive analysis device such as a total X-ray fluorescent analyzer.

The extraction apparatus disclosed in U.S. Patent Publication No. 2002-134406 may be suitable when the surface of the semiconductor substrate is hydrophobic, and the surface analysis device disclosed in U.S. Pat. No. 6,519,031 (issued to Gilton et. al.) may be suitable when the surface of the semiconductor substrate is hydrophilic.

However, the prior art surface analysis device is disadvantageous in that it cannot produce a sample from many local regions of the wafer surface simultaneously and hence, the analysis process requires a great amount of time to complete. In addition, the prior art surface analysis device has inner and outer tubes for extracting samples when numerous local regions of the wafer surface are to be analyzed. The surface analysis device sequentially analyzes the local regions of the wafer surface in order via the inner and outer tubes. However, the use of the inner and outer tubes may render the analysis process unreliable.

SUMMARY OF THE INVENTION

Accordingly, an object of the present invention is to provide a method of and apparatus for eluting impurities from many local regions of a wafer surface in a relatively short amount of time.

According to an aspect of the present invention, an apparatus for eluting impurities includes a supporting unit for supporting a substrate, and a sample plate disposed on a surface of the substrate. The sample plate includes a plurality of holes for exposing and isolating local areas of the surface of the substrate. An eluant supply system supplies eluant onto the local areas of the surface of the substrate through the holes in the sample plate. As a result, the impurities present at the local areas of the surface of the substrate are dissolved to produce a sample.

Typically, the substrate will include a silicon wafer, and a surface such as a poly silicon layer, a silicon epitaxial layer or a metal layer disposed on the wafer. The sample containing the eluant, dissolved components of the surface layer of the semiconductor substrate and the impurities will be analyzed to identify the impurities at the surface of the semiconductor substrate.

A first transfer robot moves the semiconductor substrate to the supporting unit from a container configured to contain a plurality of the substrates. A second transfer robot places the sample plate against the surface of the substrate. A third transfer robot moves at least one nozzle over the sample plate. The nozzle(s) provides the eluant to the local areas of the surface of the substrate through the holes of the sample plate. The nozzle(s) is then connected to an air pressure control unit that produces a vacuum by which the nozzle(s) extracts the sample from the holes of the sample plate. The third transfer robot then moves the nozzle(s) between the sample plate and a plurality of sample cups. The air pressure control unit generates air pressure by which the sample is delivered by the nozzle(s) into the cups.

The second transfer robot also moves the sample plate from which the sample has been extracted to a cleaning unit, and subsequently returns the cleaned sample plate onto another semiconductor substrate supported by the supporting unit.

According to the present invention, the apparatus for eluting impurities may obtain the sample in which the impurities are contained from the surface layer of the semiconductor substrate in a remarkably short amount of time. In addition, the apparatus for eluting impurities includes a cleaning unit for cleaning the sample plate before samples are produced from successive substrates, and a nozzle cleaning unit for cleaning the nozzle. Accordingly, the analysis of the samples produced is extremely reliable.

BRIEF DESCRIPTION OF THE DRAWINGS

The above and other features and advantages of the present invention will become more readily apparent by referring to the following detailed description made in conjunction with the accompanying drawings, in which.

DETAILED DESCRIPTION OF THE PREFERRED EMBODIMENTS

Figure 1:
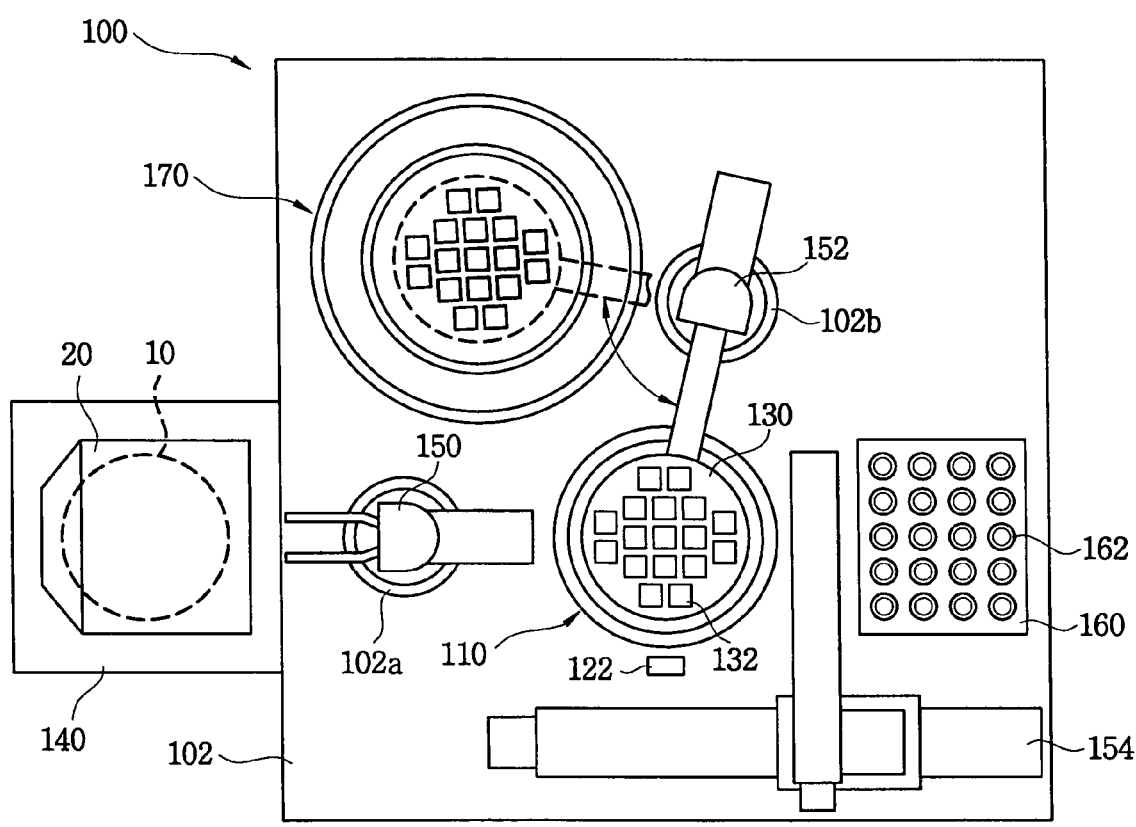
FIG. 1 is a plan view of an apparatus for eluting impurities according to the present invention.
Figure 2:
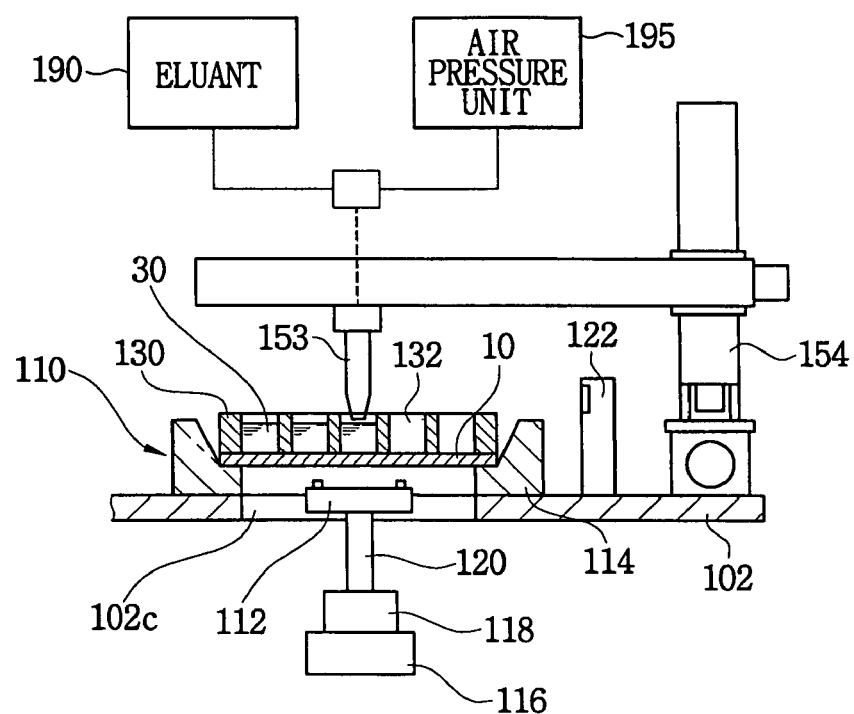
FIG. 2 is a sectional view of a sample plate and a supporting unit of the apparatus shown in FIG. 1.

The present invention now will be described more fully hereinafter with reference to the accompanying drawings, in which the preferred embodiments of the present invention are shown.

Referring first to FIGS. 1 to 5, an apparatus 100 for eluting impurities in accordance with the present invention includes a base 102, a supporting unit 110, a sample plate 130, a stage 140, a first, a second and a third transfer robot 150, 152, and 154, a sample cup tray 160, a cleaning unit 170 and a nozzle 153.

The supporting unit 110 includes a chuck 112, an edge supporter 114, and first and second driving units 116 and 118. The chuck 112 supports a central portion of a semiconductor substrate 10, and the first driving unit 116 moves the chuck 112 vertically. The edge supporter 114 supports a peripheral portion of the semiconductor substrate 10, and the second driving unit 118 rotates the chuck 112 so as to align the semiconductor substrate 10 according to an electrical signal output by an edge sensor 122. The semiconductor substrate 10 is primarily supported by the chuck 112 and is secondarily supported by the edge supporter 114.

In a preferred embodiment, the second driving unit 118 is disposed on the first driving unit 116, and the second driving unit 118 and the chuck 112 are coupled by a driving shaft 120. The first driving unit 116 may comprise an air bladder or a pneumatic cylinder, and the second driving unit 118 may comprise a motor. However, the first and second driving units 116 and 118 may comprise other types of driving devices known, per se, to those of ordinary skill in the art.

The semiconductor substrate 10 typically comprises a silicon wafer having a notch or a flat zone, and a surface layer 10a (FIG. 5) such as a silicon layer, a silicon epitaxial layer or a metal layer.

The sample plate 130 may have substantially the same shape as the semiconductor substrate 10. For example, the sample plate 130 may be a disc having a diameter that is substantially identical to that of the silicon wafer. The sample plate 130 is abutted against the surface layer 10a of the substrate 10 while the sample is being obtained from the surface layer 10a of the semiconductor substrate 10. In addition, the sample plate 130 includes a plurality of holes 132 by which a sample from many local areas of the surface layer 10a can be obtained simultaneously. The holes are uniformly distributed across the entire sample plate 130.

The stage 140 is connected to a sidewall of the base 102, and supports a container 20 for containing a plurality of semiconductor substrates 10. However, the stage 140 may also be disposed on the base 102. The container 20 comprises a conventional wafer cassette or a front opening unified pod (FOUP).

The sample cup tray 160 faces the stage 140, and supports a plurality of sample cups 162 for storing samples obtained from the sample plate 130.

The first transfer robot 150 is disposed between the stage 140 and the supporting unit 110, and transfers the semiconductor substrates 10 between the container 20 and the supporting unit 110.

The cleaning unit 170 (FIG. 4) is disposed adjacent the supporting unit 110, and cleans the sample plate 130 using a cleanser 60. The cleanser 60 may be ultra-pure water. The cleaning unit 170 includes an inner reservoir 172 for receiving the cleanser 60, and an outer reservoir 174 surrounding the inner reservoir 172 so as to receive cleanser 60 overflowing from the inner reservoir 172. The sample plate 130 is connected to a robot arm of the second transfer robot 152 by a connecting member 156. The second transfer robot 152 moves the sample plate 130 between the cleaning unit 170 and the supporting unit 110.

A nozzle 153 is coupled to the third transfer robot 154, and the third transfer robot 154 moves the nozzle 153 between the sample plate 130 and the sample cup tray 160.

The holes 132 of the sample plate 130 expose numerous local areas of the surface of the substrate, and the nozzle 153 dispenses eluant 30 onto each of the local areas of the substrate surface through the holes 132. The eluant 30 is capable of dissolving the surface layer 10a of the semiconductor substrate 10 so that the impurities 40 are separated from the semiconductor substrate 10. A solution 50 containing the components of the surface layer 10a and the impurities 40 serves as a sample by which the impurities 40 in local areas of the substrate surface can be analyzed.

Figure 5:
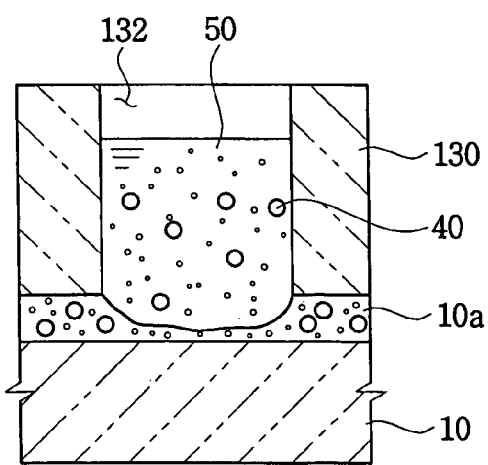
FIG. 5 is an enlarged sectional view of a portion of the sample plate of the apparatus shown in FIG. 1 and substrate showing a sample containing impurities eluted from a surface of the substrate.

More specifically, referring to FIG. 5, the surface layer 10a of the semiconductor substrate 10 is dissolved by the eluant 30, whereby a solution 50 including the impurities 40 is produced. Examples of the impurities 40 include lithium (Li), boron (B), sodium (Na), iron (Fe), copper (Cu), calcium (Ca), chromium (Cr), aluminum (Al), nickel (Ni), zinc (Zn), tungsten (W), lead (Pb), barium (Ba), magnesium (Mg), and arsenic (As).

The solution 50 is transferred into the sample cups 162 in the sample cup tray 160 by means of the nozzle 153 and the third transfer robot 154. Note, the nozzle 153 is connected to an eluant source 190 when the eluant 30 is being dispensed onto the local areas of the surface layer 10a of the semiconductor substrate 10. On the other hand, the nozzle 153 is connected to an air pressure control unit 195 when the solute 50 is being extracted from the local areas of the surface layer 10a by the nozzle 153. The air pressure control unit 195 can selectively produce a vacuum and air pressure that allows the nozzle 153 to extract the solute from the holes 132 of the sample plate 130 and discharge the solution 50 into the cups 162, respectively.

Although just one nozzle 153 has been described as being connected to the third transfer robot 154, a plurality of nozzles may be supported by the third transfer robot 154. In this case, a circular plate having substantially the same shape as the sample plate 130 is coupled to the third transfer robot 154, and the plurality of nozzles extend downwardly from the circular plate. Preferably, each of the nozzles corresponds to a respective one of the holes 132 of the sample plate 130. In addition, the sample cup tray 160 could be in the form of a disc having a shape substantially identical to that of the sample plate 130, and the sample cups 162 could be arrayed in correspondence with the holes 132 of the sample plate 130. In this way, a plurality of samples may be simultaneously obtained from the local areas of the surface layer 10a of the semiconductor substrate 10.

The eluant 30 may be any suitable solvent, such as an organic solvent. For instance, when the semiconductor substrate 10 is a bare silicon wafer, or when the surface layer 10a of the semiconductor substrate 10 is a polysilicon layer or a silicon epitaxial layer, the eluant 30 may comprise hydrogen fluoride (HF), acetic acid ($CH_3COOH$), nitric acid ($HNO_3$) and pure water ($H_2O$). On the other hand, when the surface layer 10a is a metal layer, the eluant 30 may be a known solution capable of etching the metal layer or an organic solvent. In any case, the sample is analyzed using a destructive analysis device such as an atomic absorption spectroscope or an ICP-mass spectroscope, or a non-destructive analysis device such as a total X-ray fluorescent analyzer.

Referring now again to FIGS. 1 and 2, the base 102 has first, second and third openings 102a, 102b and 102c in the top thereof. The first and second transfer robots 150 and 152 extend upwardly through the first and second openings 102a and 102b, respectively. The edge supporter 114 is disposed along the periphery of the third opening 102c. Preferably, the first and second transfer robots 150 and 152 each comprise a scalar robot capable of vertical and rotary movements, and the third transfer robot 154 comprises a three axis Cartesian robot. However, the first, second and third transfer robots may comprise other types of robots known per se to those of ordinary skill in the art.

The chuck 112 supports a central portion of the semiconductor substrate 10 that is transferred from the container 20 to the supporting unit 110 by the first transfer robot 150. The first driving unit 116 moves the chuck 112 upwards into contact with the central portion of the semiconductor substrate 10, and the second driving unit 118 rotates the semiconductor substrate 10 in response to signals issued by the edge sensor 122 so as to align the semiconductor substrate 10. The edge sensor 122 is, for example, a conventional light sensor disposed adjacent an outer portion of the edge supporter 114. The optical elements of the light sensor, e.g., the light-transmitter and light receptor, are operative to detect a notched portion or a flat zone of the semiconductor substrate 10.

Figure 3:
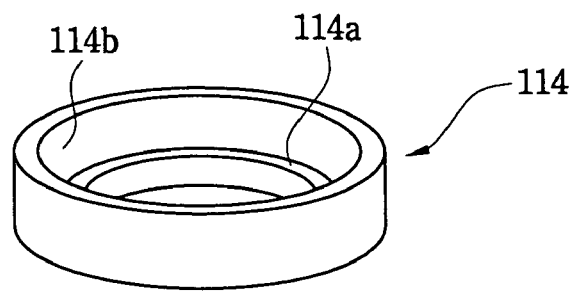
FIG. 3 is a perspective view of an edge supporter of the apparatus shown in FIG. 1.
Figure 4:
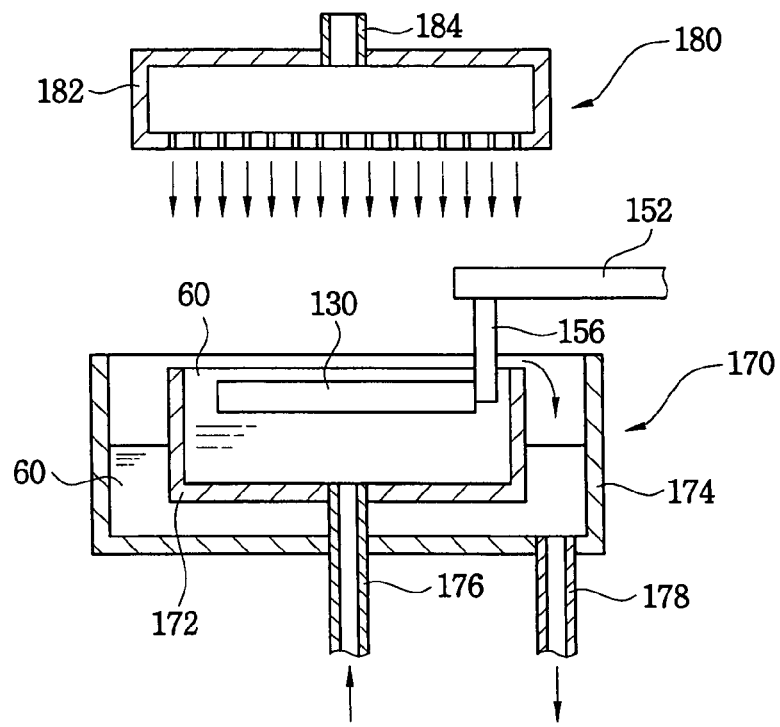
FIG. 4 is a sectional view of a cleaning unit of the apparatus shown in FIG. 1.

After the semiconductor substrate 10 is oriented, i.e., aligned, by the edge sensor 122 and the second driving unit 118, the first driving unit 116 moves the chuck 112 downwards until the peripheral portion of the semiconductor substrate 10 is supported by the edge supporter 114. As best shown in FIG. 3, the edge supporter 114 is annular, and has a stepped portion on an inner side thereof. The stepped portion is defined by an intermediate support surface 114a that lies in a plane extending substantially in the radial direction of the annular member 114 so as to support the outer peripheral portion of the substrate 10, and an upper guide surface 114b that is inclined in a radially inward direction of the annular member from an upper portion of the annular member towards the intermediate support surface 114a. The stepped portion 114a supports the peripheral portion of the semiconductor substrate. The semiconductor substrate 10 is guided onto the intermediate support surface 114a by the guide surface 114b of the edge supporter 114 such that the center of the semiconductor substrate 10 coincides with the center of the edge supporter 114.

Then the second transfer robot 152 places the sample plate 130 against the surface of the semiconductor substrate 10. Subsequently, a sample is obtained from a plurality of local areas of the surface layer 10a of the semiconductor substrate 10. Finally, the second transfer robot 152 transfers the sample plate 130 to the inner reservoir 172 of the cleaning unit 170.

In addition to the inner reservoir 172 and outer reservoir 174, the cleaning unit 170 includes an a cleanser inlet 176 and a cleanser outlet 178. The cleanser inlet 176 extends through a bottom portion of the outer cleansing reservoir 174 and is connected to a bottom portion of the inner reservoir 172. The cleanser 60 is continuously provided into the inner reservoir 172 through the cleanser inlet 176 so as to eventually overflow the inner reservoir 172 into the outer reservoir 174. The cleanser 60 is discharged from the outer cleansing reservoir 174 through the cleanser outlet 178.

While the sample plate is being cleaned in the cleaning unit 170, the first transfer robot 150 transfers the semiconductor substrate 10 from which the sample has been obtained to the container 20 from the supporting unit 110. Also, the first transfer robot 150 transfers then transfers a new semiconductor substrate from which a sample is to be obtained to the supporting unit 110 from the container 20.

A drying unit 180 is disposed above the cleaning unit 170 for drying the sample plate 130 after it is cleaned by the cleaning unit 170. The drying unit 180 includes a showerhead 182, and a gas supply line 184 for supplying the gas to the showerhead 182. The gas may be an inert gas such as nitrogen or purified air. The showerhead 182 includes a chamber in which the drying gas accumulates, and a plurality of holes through which the drying gas is sprayed onto the sample plate 130.

The apparatus 100 for eluting impurities according to the present invention further includes a nozzle-cleaning unit for cleaning each nozzle 153 connected to the third transfer robot 154. The nozzle-cleaning unit may have a structure that is substantially identical to that shown in FIG. 4.

Figure 6:
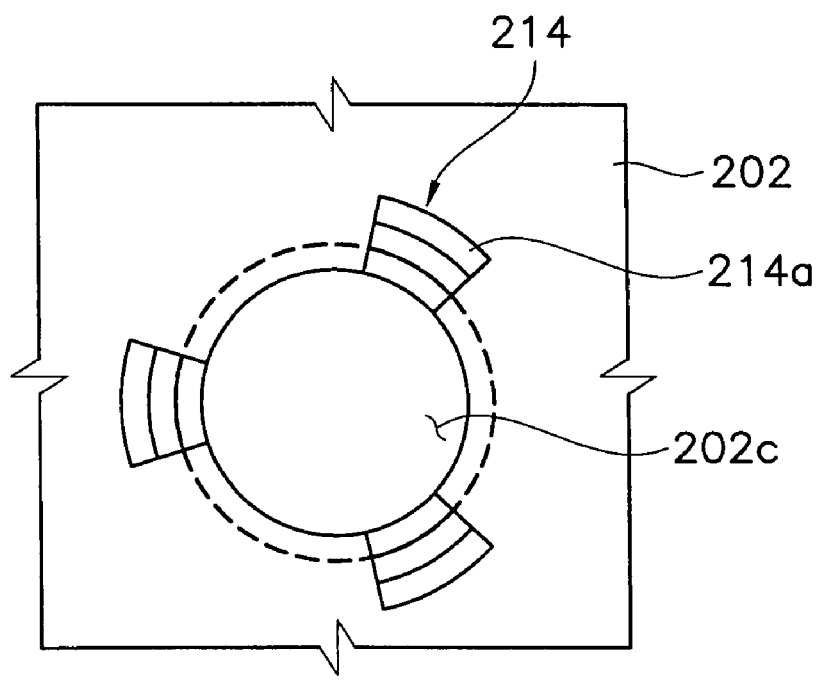
FIG. 6 is a plan view of another type of edge supporter that can be employed by the apparatus shown in FIG. 1.

FIG. 6 is a plan view of another type of edge supporter that can be used in the apparatus 100 according to the present invention. The edge support 214 includes a plurality of discrete support members 214a for supporting the outer peripheral edge portion of the semiconductor substrate 10. The support members 214a are disposed along the periphery of the third opening 202c of the base 202. Preferably, each support member 214a is fan-shaped in plan, although other shapes are possible. In addition, although three discrete support members 214a are shown in the figure, the present invention is not limited to any particular number of support members 214a.

Figure 7A:
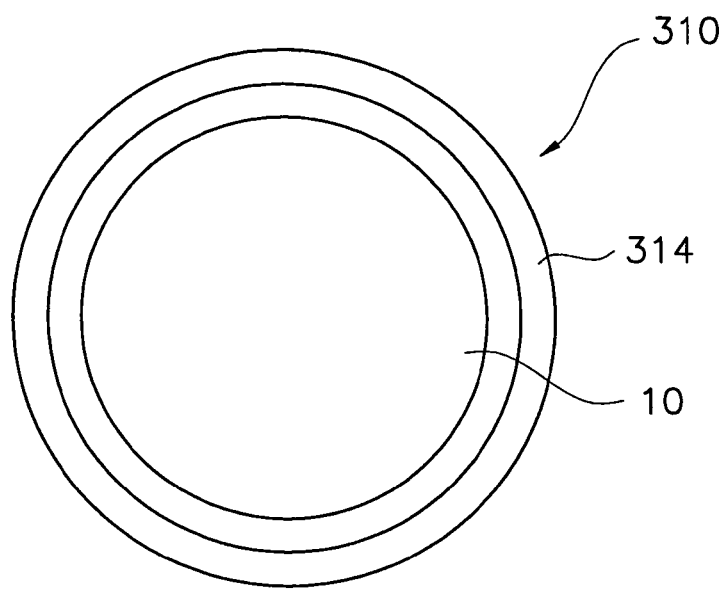
FIG. 7A is a plan view of another type of supporting unit that can be employed by the apparatus shown in FIG. 1.
Figure 7B:
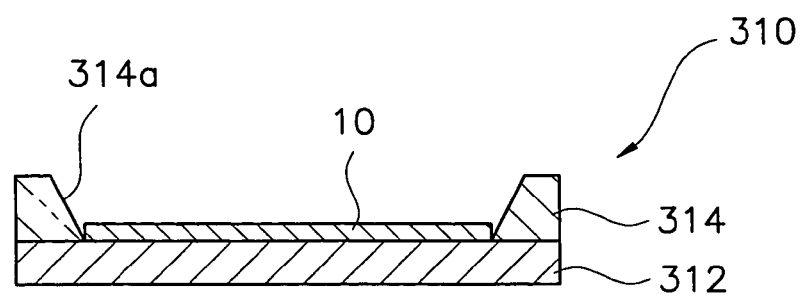
FIG. 7B is a sectional view of the supporting unit shown in FIG. 7A.

FIGS. 7A and 7B illustrate yet another supporting unit according to the present invention. The supporting unit 310 includes a chuck 312 for supporting the semiconductor substrate 10 and a guide 314 protruding upwardly from a peripheral portion of the chuck 312. The guide 314 has an inclined surface 314a for guiding the semiconductor substrate 10 onto the chuck 312 such that the center of the semiconductor substrate 10 coincides with the center of the chuck 312. In this case, the apparatus for eluting impurities may also further include a preliminary aligning unit that orients the semiconductor substrate 10 before the semiconductor substrate 10 is transferred onto the supporting unit 310. In addition, the first transfer robot 152 may also include a plurality of lift pins that may load the semiconductor substrate 10 onto the chuck 312.

Figure 7C:
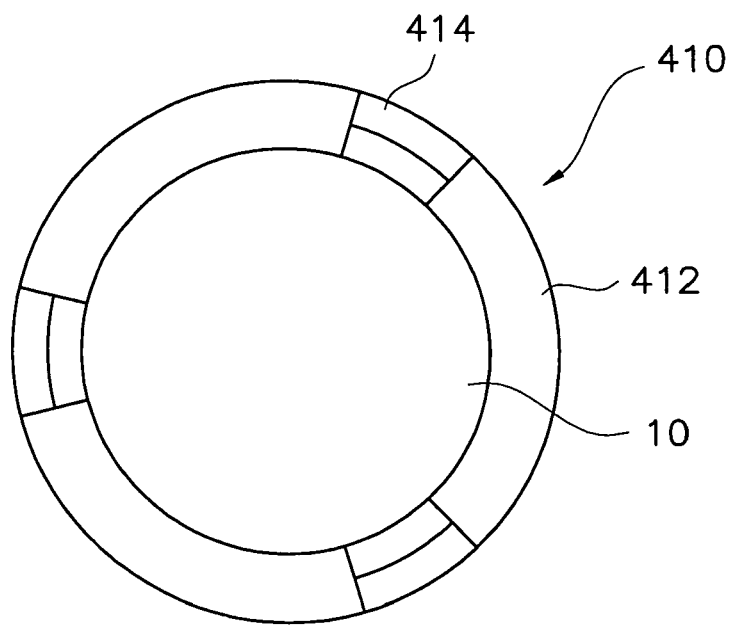
FIG. 7C is a plan view of yet another type of supporting unit that can be employed by the apparatus shown in FIG. 1.
Figure 7D:
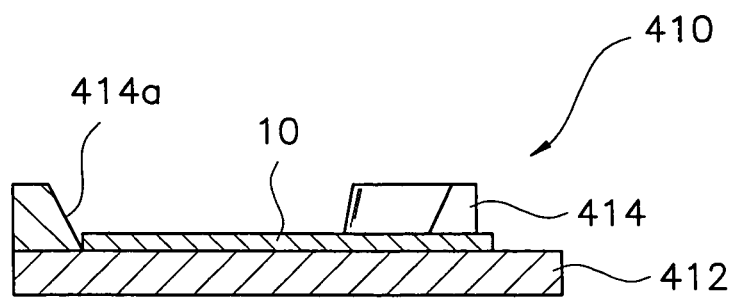
FIG. 7D is a sectional view of the supporting unit shown in FIG. 7C.

FIGS. 7C and 7D illustrate still another supporting unit according to the present invention. The supporting unit 410 includes a chuck 412 for supporting a semiconductor substrate 10, and a plurality of guides 414 each protruding upwardly from a peripheral portion of the chuck 412. Each of the guides 414 has an inclined surface 414a for guiding the semiconductor substrate 10 onto the chuck 412 such that the center of the semiconductor substrate 10 coincides with the center of the chuck 412.

According to the present invention, the apparatus for eluting impurities may produce a number of samples from the surface layer of the semiconductor substrate simultaneously. Accordingly, analyzing the semiconductor substrate completely for impurities does not require a great amount of time. In addition, the apparatus for eluting impurities includes a cleaning unit for cleaning the sample plate and a nozzle cleaning unit for cleaning the nozzle(s). Thus, the process of analyzing the samples is extremely reliable.

Although the present invention has been described above in terms of the preferred embodiments thereof, the present invention is not so limited. Rather, various changes and modifications can be made by those skilled in the art within the true spirit and scope of the present invention as hereinafter claimed.

What is claimed is:

1. An apparatus for eluting impurities, comprising:
   a supporting unit including a substrate support configured to support a substrate in the apparatus with a surface of the substrate exposed;
   a sample plate having a plurality of holes therethrough, said sample plate and said substrate support being movable relative to each other in the apparatus such that said sample plate can be positioned on the surface of a substrate supported by said substrate support, whereby said holes are disposed over local areas of the surface of the substrate, respectively; and
   an eluant supply system that supplies eluant into the holes in said plate, wherein impurities at the local areas of the surface of the substrate are dissolved by the eluant to produce a sample by which the impurities can be identified.

2. The apparatus of claim 1, wherein said supporting unit further includes a chuck, and a vertical linear driving mechanism operatively connected to said chuck to move the chuck vertically, and said substrate support is an edge supporter defining a central opening through which said chuck can be moved vertically by said driving mechanism, whereby an outer peripheral portion of a substrate can be lowered onto the edge supporter by the chuck when the chuck is driven vertically downward by the driving mechanism.

3. The apparatus of claim 2, wherein said edge supporter is an annular member having an outer side and an inner side, the inner side having a stepped portion defined by an intermediate support surface that lies in a plane extending substantially in the radial direction of the annular member so as to support the outer peripheral portion of the substrate, and an upper guide surface that is inclined in a radially inward direction of the annular member from an upper portion of the annular member towards said intermediate support surface such that the upper guide surface will guide an outer peripheral portion of a substrate onto the intermediate support surface when the substrate is lowered onto the edge supporter.

4. The apparatus of claim 2, wherein said supporting unit further comprises a rotary driving mechanism operatively connected to said chuck so as to rotate the chuck, and a sensor operative to sense a notched portion or flat zone of a substrate, wherein said rotary drive mechanism and said sensor co-act to orient a substrate relative to the edge supporter.

5. The apparatus of claim 2, wherein said sample plate has the shape of a disc.

6. The apparatus of claim 1, wherein said substrate support includes a chuck, and a guide protruding upwardly from an outer peripheral portion of the chuck, the guide having a guide surface that is inclined inwardly in a direction from an upper portion of the guide towards said chuck such that the guide will guide a substrate onto the chuck when a substrate is lowered onto the substrate support.

7. The apparatus of claim 1, and further comprising a cleaning unit that cleans the sample plate, the cleaning unit being disposed adjacent to the supporting unit.

8. The apparatus of claim 7, wherein the cleaning unit includes an inner reservoir, and an outer reservoir surrounding the inner reservoir, the outer reservoir receiving cleanser that overflows the inner reservoir.

9. The apparatus of claim 7, and further comprising a transfer robot having a working envelope that encompasses said cleaning unit and said supporting unit, said transfer robot being operable to move said sample plate between the cleaning unit and the supporting unit.

10. The apparatus of claim 9, further comprising a connecting member connecting a peripheral portion of the sample plate and the transfer robot.

11. The apparatus of claim 7, further comprising a drying unit disposed above the cleaning unit, the drying unit comprising means for spraying a gas onto the sample plate to dry the sample plate.

12. The apparatus of claim 11, wherein said means comprises a showerhead.

13. The apparatus of claim 1, and further comprising a stage, a container supported on said stage and configured to contain a plurality of substrates, and a transfer robot having a working envelope encompassing the container and the supporting unit and operable to transfer substrates between the container and the supporting unit.

14. The apparatus of claim 1, wherein said eluant supply system comprises at least one nozzle, and a source of eluant.

15. The apparatus of claim 14, and further comprising a sample cup tray, a plurality of sample cups supported by said sample cup tray, and a transfer robot to which said at least one nozzle is connected, said transfer robot having a working envelope encompassing said substrate support so as to be operable to move the nozzle between the supporting unit and the sample cup tray.

16. An apparatus for eluting impurities, comprising:
   a supporting unit including a substrate support configured to support a substrate in the apparatus with a surface of the substrate exposed;
   a sample plate having a plurality of holes therethrough, said sample plate and said substrate support being movable relative to each other in the apparatus such that said sample plate can be positioned on the surface of a substrate supported by said substrate support, whereby said holes are disposed over local areas of the surface of the substrate, respectively;
   a cleaning unit that cleans the sample plate, said cleaning unit disposed adjacent said supporting unit;

a first transfer robot having a working envelope that encompasses said cleaning unit and said supporting unit, said first transfer robot being operable to move said sample plate between the cleaning unit and the supporting unit;

an eluant supply system that supplies eluant into the holes in said plate, wherein impurities at the local areas of the surface of the substrate are dissolved by the eluant to produce a sample by which the impurities can be identified, said eluant supply system including at least one nozzle, and a source of eluant connected to said at least one nozzle;

a sample cup tray, and a plurality of sample cups supported by said tray;

a second transfer robot to which said at least one nozzle is connected, said transfer robot having a working envelope encompassing said substrate support so as to be operable to move the nozzle between the supporting unit and the sample cup tray; and an air pressure control unit that can selectively produce a vacuum and air pressure, said air pressure control unit being connected to said at least one nozzle so that said at least one nozzle can collect solution from the local areas of the surface of the substrate through the plurality of the holes of the sample plate and transfer the solution to the sample cups.

17. The apparatus of claim 16, and further comprising a stage, a container supported on said stage and configured to contain a plurality of substrates, and a transfer robot having a working envelope encompassing the container and the supporting unit and operable to transfer substrates between the container and the supporting unit.

18. The apparatus of claim 16, wherein said supporting unit further includes a chuck, and a vertical linear driving mechanism operatively connected to said chuck to move the chuck vertically, and said substrate support is an edge supporter defining a central opening through which said chuck can be moved vertically by said driving mechanism, whereby an outer peripheral portion of a substrate can be lowered onto the edge supporter by the chuck when the chuck is driven vertically downward by the driving mechanism.

19. The apparatus of claim 18, wherein said edge supporter is an annular member having an outer side and an inner side, the inner side having a stepped portion defined by an intermediate support surface that lies in a plane extending substantially in the radial direction of the annular member so as to support the outer peripheral portion of the substrate, and an upper guide surface that is inclined in a radially inward direction of the annular member from an upper portion of the annular member towards said intermediate support surface such that the upper guide surface will guide an outer peripheral portion of a substrate onto the intermediate support surface when the substrate is lowered onto the edge supporter.

20. The apparatus of claim 16, wherein said sample plate has the shape of a disc.

\* \* \* \* \*